United States Patent
Sheng et al.

(10) Patent No.: US 8,324,967 B2
(45) Date of Patent: Dec. 4, 2012

(54) SYSTEM AND METHOD FOR CONTROLLING A POWER AMPLIFIER USING A PROGRAMMABLE RAMP CIRCUIT

(75) Inventors: Huaimao Sheng, Shanghai (CN); Larry B. Li, Irvine, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 74 days.

(21) Appl. No.: 12/794,608

(22) Filed: Jun. 4, 2010

(65) Prior Publication Data

US 2011/0298540 A1      Dec. 8, 2011

(51) Int. Cl.
*H03G 5/16*   (2006.01)

(52) U.S. Cl. ........................................ 330/133

(58) Field of Classification Search .............. 330/133, 330/298, 207 P, 285
See application file for complete search history.

(56) References Cited

U.S. PATENT DOCUMENTS

| | | | | |
|---|---|---|---|---|
| 4,853,610 A | * | 8/1989 | Schade, Jr. | 323/316 |
| 5,278,997 A | * | 1/1994 | Martin | 455/127.1 |
| 6,480,061 B2 | * | 11/2002 | Dolman et al. | 330/2 |
| 7,149,246 B1 | * | 12/2006 | Adams et al. | 375/238 |

* cited by examiner

*Primary Examiner* — Robert Pascal
*Assistant Examiner* — Khiem Nguyen

(57) ABSTRACT

A system and method for controlling a power amplifier using a programmable ramp circuit involves receiving an input bias current at a programmable ramp circuit, generating an output bias current based on the input bias current using the programmable ramp circuit, and transmitting the output bias current from the programmable ramp circuit to a power amplifier for amplifying a radio frequency signal.

18 Claims, 6 Drawing Sheets

SYSTEM AND METHOD FOR CONTROLLING A POWER AMPLIFIER USING A PROGRAMMABLE RAMP CIRCUIT

BACKGROUND

A power amplifier is an amplifier that amplifies an input signal into an output signal with larger power. A power amplifier can be used in a wireless communications system to amplify a radio frequency (RF) signal. However, switching a power amplifier in a wireless communications system on and off can cause spectral regrowth that degrades transceiver RF performance of the wireless communications system. For example, the Adjacent Channel Power Ratio (ACPR) of the wireless communications system increases as a result of the spectral regrowth. Therefore, there is a need for a system and method that can switch a power amplifier in a wireless communications system on and off without degrading RF performance of the wireless communications system.

SUMMARY

A system and method for controlling a power amplifier using a programmable ramp circuit involves receiving an input bias current at a programmable ramp circuit, generating an output bias current based on the input bias current using the programmable ramp circuit, and transmitting the output bias current from the programmable ramp circuit to a power amplifier for amplifying a radio frequency signal. Compared to directly applying the input bias current to the power amplifier, generating the output bias current based on the input bias current and using the generated output bias current to control the power amplifier allows the desired bias current to be applied to the power amplifier. As a result, the on/off switching of the power amplifier can be controlled by programming the output bias current that is applied to the power amplifier.

In an embodiment, a method for controlling a power amplifier using a programmable ramp circuit includes receiving an input bias current at a programmable ramp circuit, generating an output bias current based on the input bias current using the programmable ramp circuit, and transmitting the output bias current from the programmable ramp circuit to a power amplifier for amplifying a radio frequency signal.

In an embodiment, a programmable ramp circuit for controlling a power amplifier includes a digital circuit and an analog circuit. The digital circuit is configured to generate bias control bits. The analog circuit is configured to generate an output bias current using an input bias current and the bias control bits and to transmit the output bias current to a power amplifier for amplifying a radio frequency signal.

In an embodiment, a power amplifier circuit includes a bandgap circuit, a programmable ramp circuit coupled to the bandgap circuit, a power amplifier driver circuit, and a power amplifier coupled to the programmable ramp circuit and the power amplifier driver circuit. The bandgap circuit is configured to generate a first bias current. The programmable ramp circuit is configured to generate a second bias current and a third bias current based on the first bias current. The power amplifier driver circuit is configured to generate a driving signal based on a radio frequency input signal under the control of the second bias current. The power amplifier is configured to amplify the driving signal under the control of the third bias current.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
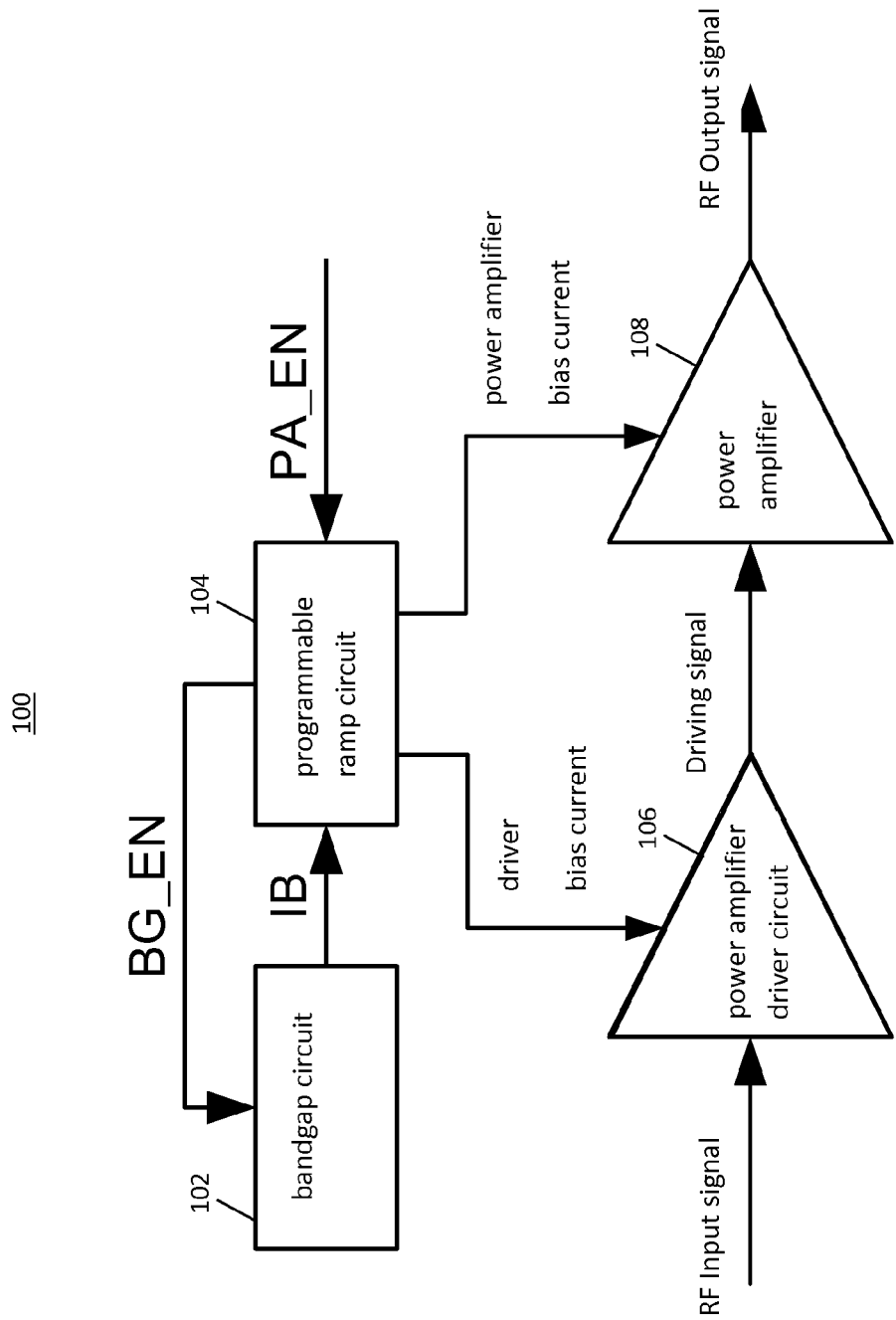
FIG. 1 is a schematic block diagram of a power amplifier circuit in accordance with an embodiment of the invention.

FIG. 1 is a schematic block diagram of a power amplifier circuit 100 in accordance with an embodiment of the invention. The power amplifier circuit is configured to amplify an RF input signal into an RF output signal with larger power. The power amplifier circuit can be used in RF communications systems that support various RF communications protocols, including without limitation, Institute of Electrical and Electronics Engineers (IEEE) 802.11, HiperLAN (High Performance Radio LAN), Global System for Mobile communications (GSM), Universal Mobile Telecommunications System (UMTS), Code Division Multiple Access (CDMA), Worldwide Interoperability for Microwave Access (WiMax) and communications protocols as defined by the 3rd Generation Partnership Project (3GPP) or the 3rd Generation Partnership Project 2 (3GPP2), 4G Long Term Evolution (LTE), IEEE 802.16 standards bodies.

In the embodiment depicted in FIG. 1, the power amplifier circuit 100 includes a bandgap circuit 102, a programmable ramp circuit 104, a power amplifier driver circuit 106, and a power amplifier 108. Although the power amplifier circuit is depicted and described with certain components and functionality, other embodiments of the power amplifier circuit may include fewer or more components to implement less or more functionality.

The bandgap circuit 102 of the power amplifier circuit 100 is configured to generate a bias current "IB." In the embodiment depicted in FIG. 1, the bandgap circuit transmits the bias current IB to the programmable ramp circuit 104. The bias current IB that is generated by the bandgap circuit is not directly applied to the power amplifier driver circuit 106 and the power amplifier 108. The bandgap circuit is further configured to be enabled or disabled by a bandgap circuit control signal "BG_EN," which is output from the programmable ramp circuit. In an embodiment, the bandgap circuit is configured to be enabled to generate the bias current IB when the control signal BG_EN is logic high and to be disabled when the control signal BG_EN is logic low. In another embodiment, the bandgap circuit is configured to be enabled to generate the bias current IB when the control signal BG_EN is logic low and to be disabled when the control signal BG_EN is logic high.

The programmable ramp circuit 104 of the power amplifier circuit 100 is coupled to the bandgap circuit 102 and is configured to generate a driver bias current and a power amplifier bias current based on the bias current IB. In the embodiment depicted in FIG. 1, the programmable ramp circuit transmits the driver bias current to the power amplifier driver circuit 106 and the power amplifier bias current to the power amplifier 108. Compared to directly applying the bias current IB to the power amplifier, generating bias currents based on the bias current IB and using the generated bias currents to control the power amplifier driver circuit and the power amplifier allows the desired bias currents to be applied to the power amplifier driver circuit and the power amplifier. For example, bias currents that are applied to the power amplifier driver circuit and the power amplifier can be programmed to ensure a gradual on/off switching of the power amplifier. As a result of the gradual on/off switching of the power amplifier, spectral regrowth that degrades transceiver RF performance of a wireless communications system in which the amplifier is located is reduced.

Additionally, the programmable ramp circuit 104 can be enabled or disabled by a power amplifier control signal "PA_EN." The programmable ramp circuit is also configured to generate the control signal BG_EN in response to the control signal PA_EN. The control signal PA_EN may be input into the programmable ramp circuit from a controller, which can be a baseband controller in a Bluetooth communications system or a Medium Access Control (MAC) controller in a wireless local area network (WLAN) communications system. In an embodiment, the programmable ramp circuit is configured to be enabled to generate the driver bias current and the power amplifier bias current when the control signal PA_EN is logic high and to be disabled when the control signal PA_EN is logic low. In another embodiment, the programmable ramp circuit is configured to be enabled to generate the driver bias current and the power amplifier bias current when the control signal PA_EN is logic low and to be disabled when the control signal PA_EN is logic high. In some embodiments, the control signal PA_EN may be the only control signal that is input to the power amplifier circuit.

Figure 2:
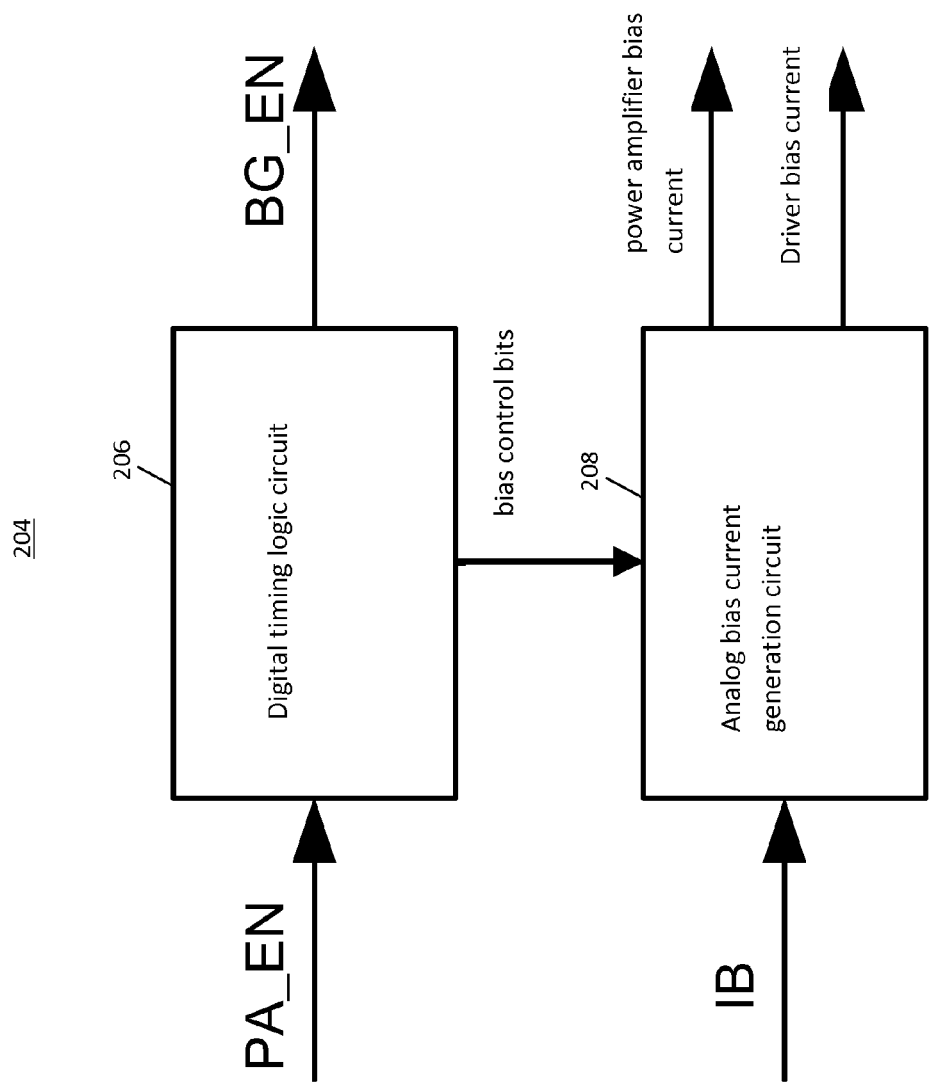
FIG. 2 depicts an embodiment of the programmable ramp circuit depicted in FIG. 1.

FIG. 2 depicts an embodiment of the programmable ramp circuit 104 depicted in FIG. 1. In the embodiment depicted in FIG. 2, the programmable ramp circuit 204 includes a digital timing logic circuit 206 and an analog bias current generation circuit 208.

The digital timing logic circuit 206 of the programmable ramp circuit 204 is configured to generate bias control bits. The bias control bits can be used to control the time of the transient slop of the driver bias current that is applied to the power amplifier driver circuit 106 and the power amplifier bias current that is applied to the power amplifier 108. In the embodiment depicted in FIG. 2, the digital circuit is further configured to enable the programmable ramp circuit in response to the control signal PA_EN and to generate the control signal BG_EN. In an embodiment, the digital timing logic circuit is configured to program the bias control bits to control the delay time of the driver bias current and the delay time of the power amplifier bias current. In another embodiment, the digital timing logic circuit is configured to program the bias control bits to control the delay time and transition shape of the driver bias current and the delay time and transition shape of the power amplifier bias current. The digital timing logic circuit may receive other input signal/input signals besides the control signal PA_EN. For example, the digital timing logic circuit receives a clock signal and/or a timing control signal.

By controlling the delay time and transition shape of the driver bias current and the delay time and transition shape of the power amplifier bias current, rising and falling of the signal level of an output signal of the power amplifier 108 is made to be gradual in the on/off switching operation of the power amplifier. As a result, spectral regrowth that degrades transceiver RF performance and the Adjacent Channel Power Ratio (ACPR) of a wireless communications system in which the power amplifier is located is reduced.

Figure 3:
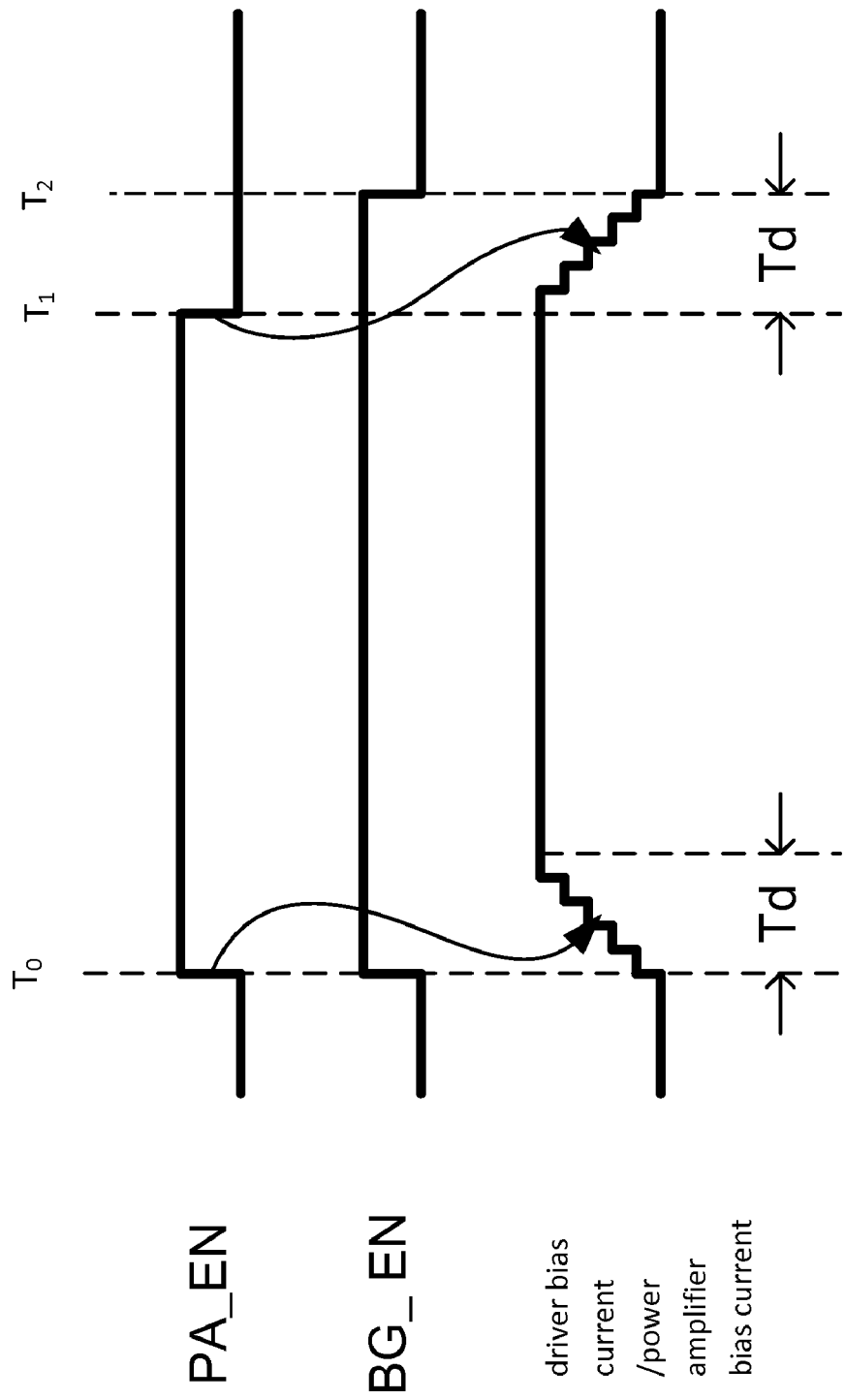
FIG. 3 is a time-based graph showing examples of some control signals and bias currents of the power amplifier circuit depicted in FIG. 1.

FIG. 3 is a time-based graph showing examples of the control signals PA_EN and BG_EN, the driver bias current, and the power amplifier bias current. Although the driver bias current and the power amplifier bias current are shown in FIG. 3 as having identical delay time and identical transition type, the driver bias current and the power amplifier bias current may have different delay time and different transition types in other embodiments.

In the graph of FIG. 3, the control signal PA_EN changes from logic low to logic high at a point of time $T_0$. In response to the change of the control signal PA_EN, the control signal BG_EN also changes from logic low to logic high at the point of time $T_0$. In an embodiment, the control signal BG_EN changes from logic low to logic high after a slight delay period following the point of time $T_0$. The driver bias current and the power amplifier bias current begin shape transitions from zero level at the point of time $T_0$ and reach a stable level after a time period of Td. The control signal PA_EN changes from logic high to logic low at a point of time $T_1$. In response to the change of the control signal PA_EN, the control signal BG_EN changes from logic high to logic low at the point of time $T_2$. The driver bias current and the power amplifier bias current begin shape transitions from the stable level at the point of time $T_1$ and reach zero level after a time period of Td at the point of time $T_2$. In other words, the driver bias current and the power amplifier bias current have a delay time or a transient time of Td compared to the control signals PA_EN and BG_EN.

The digital timing logic circuit 206 is configured to program the delay time Td. For different applications, the value of the delay time Td can be programmed to be different. For example, a Bluetooth communications system requires the delay time Td to be between 2 milliseconds (μs) and 4 μs. The transition shape of the driver bias current and the power amplifier bias current can also be programmed to be different for different applications.

Referring back to FIG. 2, the analog bias current generation circuit 208 of the programmable ramp circuit 204 is coupled to the digital timing logic circuit 206. In the embodiment depicted in FIG. 2, the analog bias current generation circuit is configured to generate the driver bias current and the power amplifier bias current using the bias current IB that is received from the bandgap circuit 102 and the bias control bits that are received from the digital timing logic circuit.

By including the digital timing logic circuit 206, the programmable ramp circuit 204 can be programmed to control the transition shapes of the driver bias current and the power amplifier bias current. Additionally, by including the digital timing logic circuit and the analog bias current generation circuit 208, the programmable ramp circuit does not need Resistor Capacitor (RC) components as delay cells. As a result, the layout size of the programmable ramp circuit can be relatively small and the material cost of the analog ramp circuit can be relatively low, compared to a conventional analog ramp circuit. For example, it may be difficult to precisely program the transition shapes of the driver bias current and the power amplifier bias current using an analog ramp circuit. Additionally, an analog ramp circuit needs RC components as delay cells. As a result, the layout size of the analog ramp circuit is relatively high and the material cost of the analog ramp circuit is relatively high.

Figure 4:
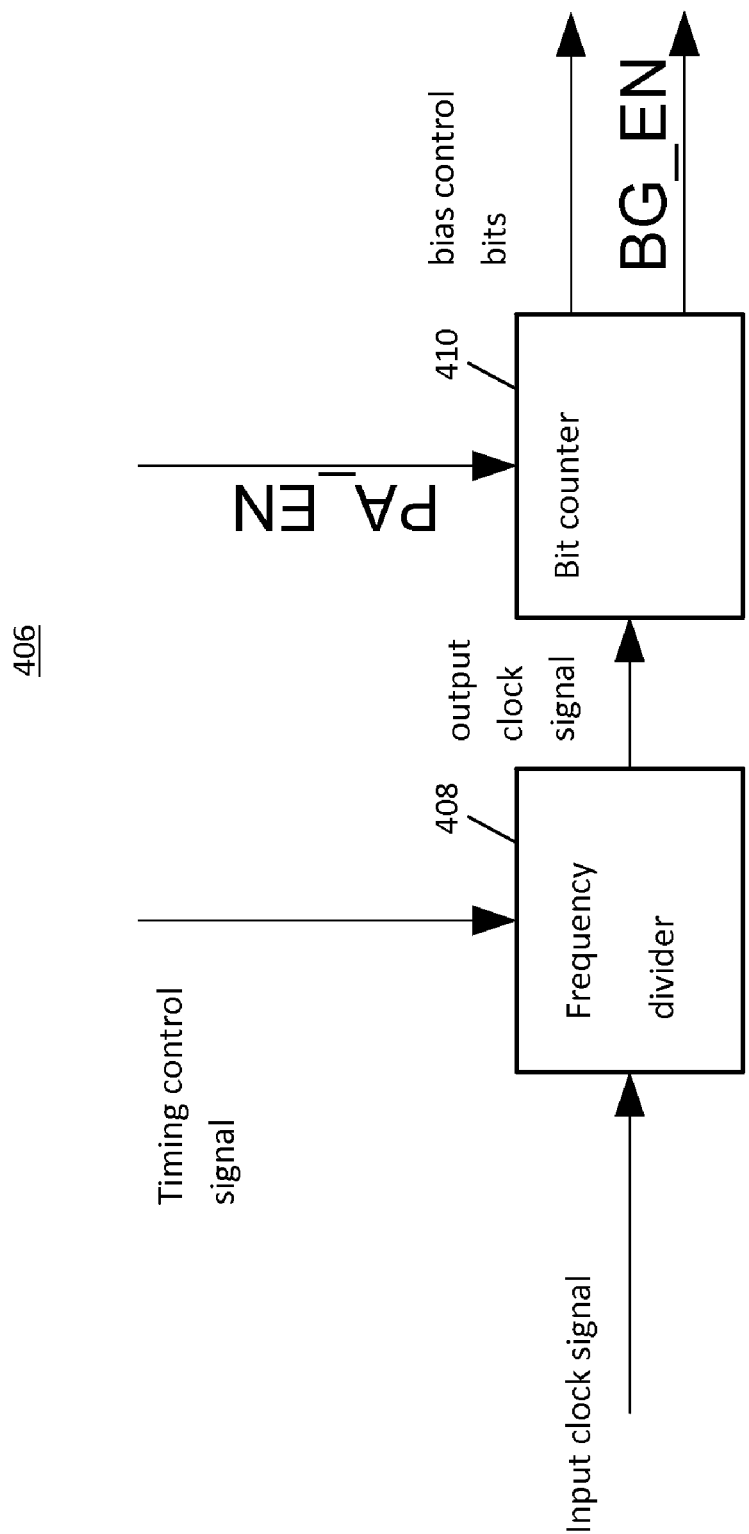
FIG. 4 depicts an embodiment of the digital timing logic circuit depicted in FIG. 2.

FIG. 4 depicts an embodiment of the digital timing logic circuit 206 depicted in FIG. 2. In the embodiment depicted in FIG. 4, the digital timing logic circuit 406 includes a frequency divider 408 and a bit counter 410.

The frequency divider 408 of the digital timing logic circuit 406 receives an input clock signal and a timing control signal. The frequency of the input clock signal can be selected according to the delay time Td of FIG. 3. The timing control signal controls the division ratio of the frequency divider. The timing control signal may come from a baseband chip that controls a RF front-end of a wireless communications system. The frequency divider is configured to convert the clock signal into an output clock signal with a lower frequency clock according to the timing control signal and to output the output clock signal to the bit counter 410.

The bit counter 410 of the digital timing logic circuit 406 is configured to be enabled by the control signal PA_EN to generate bias control bits and the control signal BG_EN according to the output clock signal that is received from the frequency divider 408. In an embodiment, a rising edge of the control signal PA_EN such as the rising edge of the control signal PA_EN at the point of time $T_0$ in FIG. 3 triggers the bit counter to count from a first binary value such as 0000 to a second binary value such as 1111. In this case, the values of the bias control bits are 1111. A falling edge of the control signal PA_EN such as the falling edge of the control signal PA_EN at the point of time $T_1$ in FIG. 3 triggers the bit counter to count from the second binary value 1111 to the first binary value 0000. In this case, the values of the bias control bits are 0000. In another embodiment, a falling edge of the control signal PA_EN triggers the bit counter to count from a first binary value such as 0000 to a second binary value such as 1111 and a rising edge of the control signal PA_EN triggers the bit counter to count from the second binary value 1111 to the first binary value 0000. During the counting, the bit counter incrementally increases or decreases the counter value at each clock cycle of the output clock signal. For example, the bit counter increases or decreases the counter value one binary bit "1" at each clock cycle of the output clock signal. The control signal BG_EN is generated from the control signal PA_EN. In an embodiment, the timing relationship between the control signal BG_EN and the control signal PA_EN is in accordance with FIG. 3. When the control signal PA_EN changes to logic high, the control signal BG_EN changes to logic high with almost no delay. When the control signal PA_EN changes to logic low, the control signal BG_EN changes to logic low after the delay time Td.

Figure 5:
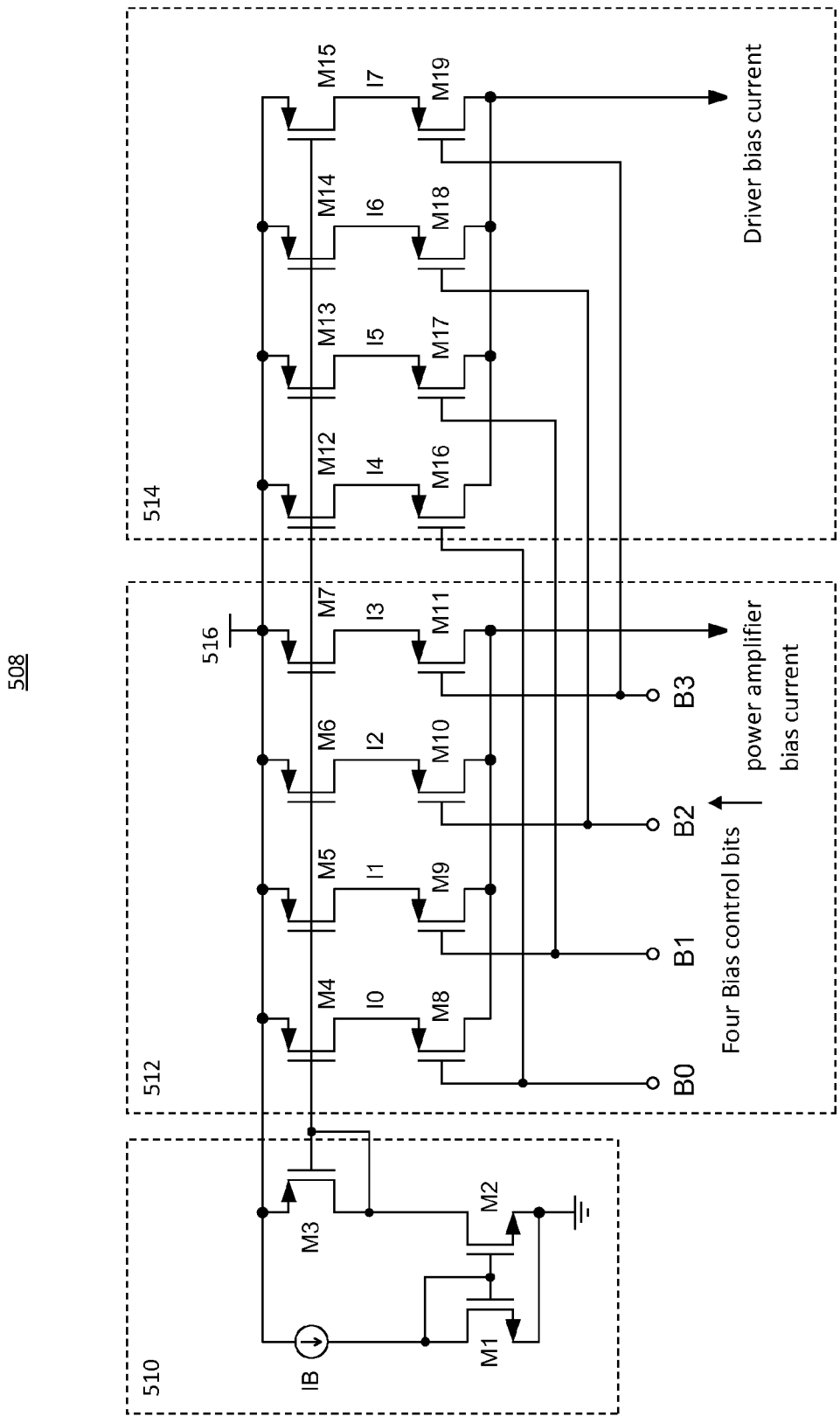
FIG. 5 depicts an embodiment of the analog bias current generation circuit depicted in FIG. 2.

FIG. 5 depicts an embodiment of the analog bias current generation circuit 208 depicted in FIG. 2. In the embodiment depicted in FIG. 5, the analog bias current generation circuit 508 includes three analog sub-circuits 510, 512, 514.

The first analog sub-circuit 510 of the analog bias current generation circuit 508 is coupled to the bandgap circuit 102 (not shown in FIG. 5) to receive the bias current IB. The first analog sub-circuit is also coupled to ground. The first analog sub-circuit includes transistors M1, M2, and M3. Transistors M1 and M2 are current mirror transistors. Transistor M3 is connected to a supply voltage 516.

The second analog sub-circuit 512 of the analog bias current generation circuit 508 is coupled between the first analog sub-circuit 510 and the third analog sub-circuit 514. The second analog sub-circuit is configured to generate the power amplifier bias current. In the embodiment depicted in FIG. 5, the second analog sub-circuit includes transistors M4-M11. Transistors M3-M7 are current mirror transistors. Transistors M4-M7 are connected to the supply voltage 516. Transistors M8-M11 are coupled to the digital timing logic circuit 206 (not shown in FIG. 5) via terminals B0-B3. In the embodiment depicted in FIG. 5, transistors M8-M11 are configured to serve as switches and to be controlled by four bias control bits that are received through the terminals B0-B3. Specifically, transistors M4-M7 generate currents I0-I3 and transistors M8-M11 selectively sum the currents I0-I3 to generate the power amplifier bias current.

The third analog sub-circuit 514 of the analog bias current generation circuit 508 is a duplication of the second analog sub-circuit. The third analog sub-circuit is configured to generate the driver bias current. In the embodiment depicted in FIG. 5, the third analog sub-circuit is coupled to the second analog sub-circuit 512 and includes transistors M12-M19. Transistors M12-M15 are connected to the supply voltage 516. Transistors M16-M19 are coupled to the digital timing logic circuit 206 (not shown in FIG. 5) and the terminals B0-B3. Transistors M16-M19 are configured to serve as switches and to be controlled by the four bias control bits that are received through the terminals B0-B3. Specifically, transistors M12-M15 generate currents I4-I7 and transistors M16-M19 selectively sum the currents I4-I7 to generate the driver bias current.

Referring back to FIG. 1, the power amplifier driver circuit 106 of the power amplifier circuit 100 is configured to generate a driving signal for the power amplifier 108 based on an RF input signal under the control of the driver bias current. In some embodiments, the power amplifier circuit does not include the power amplifier driver circuit and the programmable ramp circuit 104 only generates the power amplifier bias current for controlling the power amplifier. Although the power amplifier driver circuit is shown in FIG. 1 as being directly connected to the power amplifier without any intermediate device, the power amplifier driver circuit may be connected to the power amplifier through at least one intermediate device in other embodiments.

The power amplifier 108 of the power amplifier circuit 100 is coupled to the programmable ramp circuit 104 and the power amplifier driver circuit 106. In the embodiment depicted in FIG. 1, the power amplifier is configured to amplify the driving signal that is received from the power amplifier driver circuit to generate an RF output signal under the control of the power amplifier bias current that is received from the programmable ramp circuit.

An example operation of the power amplifier circuit 100 is described as follows. The programmable ramp circuit 104 is enabled by the control signal PA_EN and generates the control signal BG_EN. After receiving the control signal BG_EN, the bandgap circuit 102 is enabled and generates the bias current IB. The programmable ramp circuit generates the driver bias current and the power amplifier bias current using the bias current IB. Then, the power amplifier driver circuit 106 and the power amplifier 108 amplify the RF input signal into the RF output signal under the control of the driver bias current and the power amplifier bias current.

Figure 6:
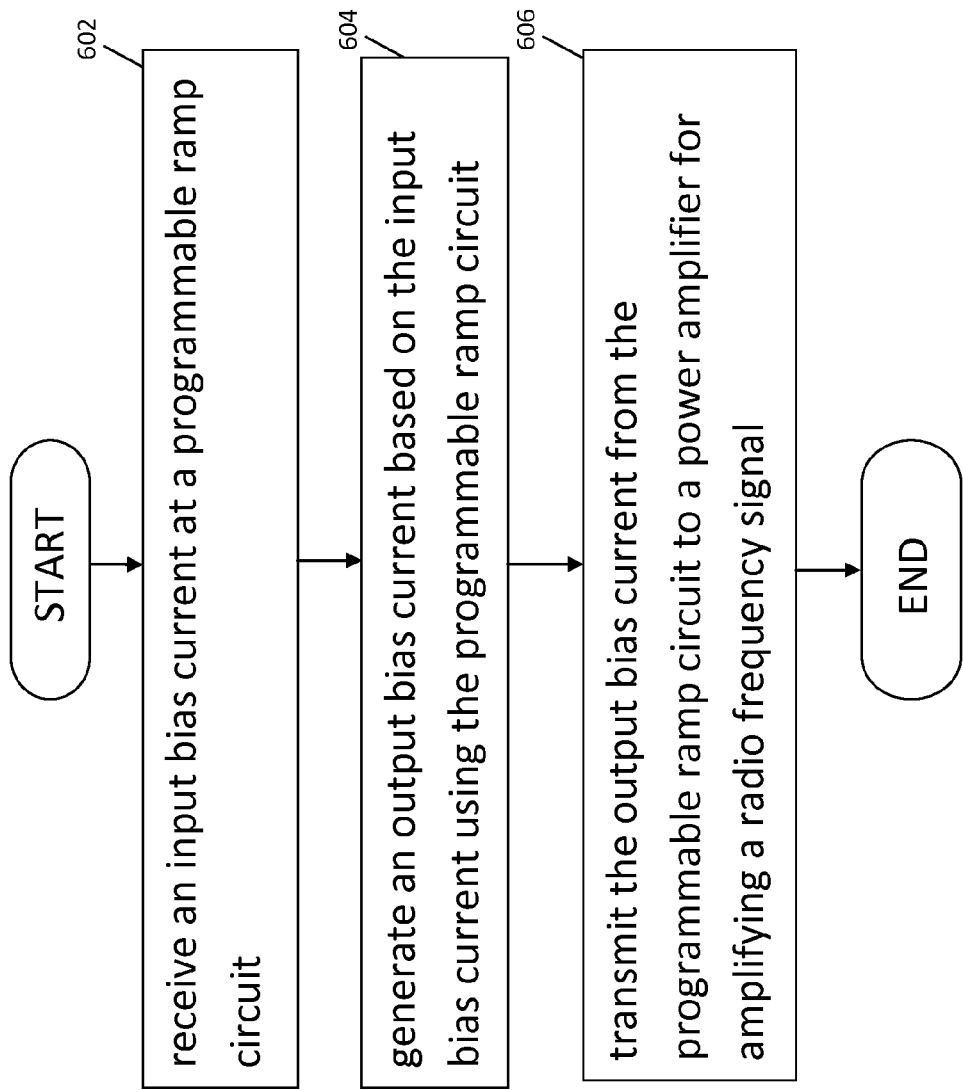
FIG. 6 is a process flow diagram of a method for controlling a power amplifier using a programmable ramp circuit in accordance with an embodiment of the invention.

FIG. 6 is a process flow diagram of a method for controlling a power amplifier using a programmable ramp circuit in accordance with an embodiment of the invention. At block 602, an input bias current is received at a programmable ramp circuit. At block 604, an output bias current is generated based on the input bias current using the programmable ramp circuit. At block 606, the output bias current is transmitted from the programmable ramp circuit to a power amplifier for amplifying a radio frequency signal.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for controlling a power amplifier using a programmable ramp circuit, the method comprising:
   receiving an input bias current at the programmable ramp circuit;
   generating an output bias current based on the input bias current using the programmable ramp circuit;
   transmitting the output bias current from the programmable ramp circuit to the power amplifier for amplifying a radio frequency signal;
   generating a second output bias current based on the input bias current using the programmable ramp circuit; and
   transmitting the second output bias current from the programmable ramp circuit to a power amplifier driver circuit for driving the power amplifier.

2. The method of claim 1 further comprising:
   generating bias control bits; and
   controlling delay time of the output bias current using the bias control bits.

3. The method of claim 1 further comprising:
   generating bias control bits; and
   controlling delay time and transition shape of the output bias current using the bias control bits.

4. The method of claim 1 further comprising:
   generating bias control bits; and
   controlling delay time of the output bias current and delay time of the second output bias current using the bias control bits.

5. The method of claim 1 further comprising:
   generating bias control bits; and
   controlling delay time and transition shape of the output bias current and delay time and transition shape of the second output bias current using the bias control bits.

6. The method of claim 1 further comprising:
   enabling the programmable ramp circuit in response to a control signal;
   generating a second control signal in response to the control signal using the programmable ramp circuit; and
   transmitting the second control signal to enable or to disable a bandgap circuit that generates the input bias current.

7. The method of claim 1, wherein bias current is not applied to the power amplifier without first being processed by the programmable ramp circuit.

8. A programmable ramp circuit for controlling a power amplifier, the programmable ramp circuit comprising:
   a digital circuit configured to generate bias control bits; and
   an analog circuit configured to generate an output bias current using an input bias current and the bias control bits and to transmit the output bias current to the power amplifier for amplifying a radio frequency signal,
   wherein the digital circuit comprises a frequency divider and a bit counter, and wherein the analog circuit comprises:
   a second analog circuit configured to generate the output bias current; and
   a third analog circuit configured to generate a second output bias current, wherein the second analog circuit is a duplication of the third analog circuit.

9. The programmable ramp circuit of claim 8, wherein the digital circuit is further configured to program the bias control bits to control delay time of the output bias current using the bias control bits.

10. The programmable ramp circuit of claim 8, wherein the digital circuit is further configured to program the bias control bits to control delay time and transition shape of the output bias current using the bias control bits.

11. The programmable ramp circuit of claim 8, wherein the analog circuit is further configured to generate the second output bias current based on the input bias current, and wherein the analog circuit is further configured to transmit the second output bias current to a power amplifier driver circuit for driving the power amplifier.

12. The programmable ramp circuit of claim 8, wherein the digital circuit is further configured to enable the programmable ramp circuit in response to a control signal.

13. A power amplifier circuit, the power amplifier circuit comprising:
   a bandgap circuit configured to generate a first bias current;
   a programmable ramp circuit coupled to the bandgap circuit and configured to generate a second bias current and a third bias current based on the first bias current;
   a power amplifier driver circuit configured to generate a driving signal based on a radio frequency input signal under control of the second bias current; and
   a power amplifier coupled to the programmable ramp circuit and the power amplifier driver circuit, wherein the power amplifier is configured to amplify the driving signal under the control of the third bias current,
   wherein the programmable ramp circuit is further configured to be enabled or to be disabled by a first control signal and to generate a second control signal in response to the first control signal, and wherein the bandgap circuit is further configured to be enabled or to be disabled by the second control signal an to generate the first bias current in response to the second control signal.

14. The power amplifier circuit of claim 13, wherein the programmable ramp circuit includes:
   a digital circuit configured to generate bias control bits; and
   an analog circuit configured to generate the second bias current and the third bias current using the bias control bits.

15. The power amplifier circuit of claim 14, wherein the digital circuit is configured to program the bias control bits to control delay time of the second bias current and the third bias current.

16. The power amplifier circuit of claim 14, wherein the digital circuit is configured to program the bias control bits to control delay time and transition shape of the second bias current and delay time and transition shape of the third bias current.

17. The power amplifier circuit of claim 14, wherein the digital circuit comprises a frequency divider and a bit counter.

18. The power amplifier circuit of claim 16, wherein the analog circuit comprises a first circuit coupled to the bandgap circuit and ground, a second circuit configured to generate the second bias current, and a third circuit configured to generate the third bias current, and wherein the second circuit is a duplication of the third circuit.

* * * * *